(12) United States Patent
Chang et al.

(10) Patent No.: US 6,576,551 B1
(45) Date of Patent: Jun. 10, 2003

(54) CHEMICAL MECHANICAL POLISH PLANARIZING METHOD WITH PRESSURE COMPENSATING LAYER

(75) Inventors: Weng Chang, Taipei (TW); Chung-Shi Liu, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/467,115

(22) Filed: Dec. 20, 1999

(51) Int. Cl.[7] .............................................. H01L 21/261
(52) U.S. Cl. ...................... 438/690; 438/691; 438/692; 438/693
(58) Field of Search ................................. 438/690–693

(56) References Cited

U.S. PATENT DOCUMENTS

| | | | | |
|---|---|---|---|---|
| 5,451,551 A | * | 9/1995 | Krishnan et al. | 437/241 |
| 5,858,869 A | * | 1/1999 | Chen et al. | 438/597 |
| 5,880,018 A | * | 3/1999 | Boeck et al. | 438/619 |
| 5,897,375 A | | 4/1999 | Watts et al. | 438/693 |

* cited by examiner

*Primary Examiner*—Felisa Hiteshew
(74) *Attorney, Agent, or Firm*—George O. Saile; Stephen B. Ackerman; Stephen G. Stanton

(57) ABSTRACT

A chemical mechanical polish (CMP) planarizing method for forming a chemical mechanical polish (CMP) planarized layer within a microelectronic fabrication. There is first provided a substrate. There is then formed over the substrate a chemical mechanical polish (CMP) substrate layer having an aperture formed therein. There is then formed upon the chemical mechanical polish (CMP) substrate layer and completely filling the aperture within the chemical mechanical polish (CMP) substrate layer a blanket chemical mechanical polish (CMP) planarizable layer. There is then chemical mechanical polish (CMP) planarized, while employing a chemical mechanical polish (CMP) planarizing method, the blanket chemical mechanical polish (CMP) planarizable layer to form within the aperture from the blanket chemical mechanical polish (CMP) planarizable layer a patterned chemical mechanical polish (CMP) planarized layer. Within the method, the chemical mechanical polish (CMP) substrate layer has formed therein a pressure compensating layer which compensates for a chemical mechanical polish (CMP) pressure employed within the chemical mechanical polish (CMP) planarizing method such that the patterned chemical mechanical polish (CMP) planarized layer is formed with enhanced planarity.

21 Claims, 3 Drawing Sheets

CHEMICAL MECHANICAL POLISH PLANARIZING METHOD WITH PRESSURE COMPENSATING LAYER

BACKGROUND OF THE INVENTION

1. Field of the Invention

The present invention relates generally to methods for forming planarized layers within microelectronic fabrications. More particularly, the present invention relates to chemical mechanical polish (CMP) planarizing methods for forming planarized layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly important within the art of microelectronic fabrication to form patterned microelectronic conductor layers within microelectronic fabrications with enhanced levels of uniformity, and in particular surface planarity uniformity. Such enhanced levels of uniformity, including surface planarity uniformity, provide microelectronic fabrications wherein resistance-capacitance delay times may be optimally minimized, since: (1) patterned microelectronic conductor layers of uniform dimension provide patterned microelectronic conductor layers of predictable current carrying capacity, while; (2) patterned microelectronic conductor layers of uniform surface planarity provide patterned microelectronic conductor layers to which low contact resistance connections to adjoining patterned microelectronic conductor layers may be made within microelectronic fabrications. To the end of providing within microelectronic fabrications patterned microelectronic conductor layers with enhanced uniformity, and in particular with enhanced surface planarity uniformity, it has become common in the art of microelectronic fabrication to fabricated patterned microelectronic conductor layers, including but not limited to patterned microelectronic conductor contact layers and patterned microelectronic conductor interconnect layers, while employing chemical mechanical polish (CMP) planarizing damascene methods.

Similarly, while chemical mechanical polish (CMP) planarizing damascene methods are thus desirable within the art of microelectronic fabrication for forming with enhanced uniformity patterned microelectronic conductor layers within microelectronic fabrications, chemical mechanical polish (CMP) planarizing damascene methods are nonetheless also not entirely without problems when employed in the art of microelectronic fabrication for forming patterned microelectronic conductor layers within microelectronic fabrications. In that regard, it is known in the art of microelectronic fabrication that chemical mechanical polish (CMP) planarizing methods when employed for forming chemical mechanical polish (CMP) planarized patterned microelectronic conductor layers within microelectronic fabrications often provide the chemical mechanical polish (CMP) planarized patterned microelectronic conductor layers with non-optimally planarized dished surfaces to which it is often difficult to reliably connect adjoining patterned microelectronic conductor layers within microelectronic fabrications.

It is thus towards the goal of forming within the art of microelectronic fabrication chemical mechanical polish (CMP) planarized patterned microelectronic conductor layers, as well as other chemical mechanical polish (CMP) planarized microelectronic structures, with enhanced surface planarity uniformity, that the present invention is both more specifically and more generally directed.

Various chemical mechanical polish (CMP) planarizing methods and chemical mechanical polish (CMP) planarizing materials have been disclosed within the art of microelectronic fabrication for forming chemical mechanical polish (CMP) planarized microelectronic layers and chemical mechanical polish (CMP) planarized microelectronic structures with desirable properties within microelectronic fabrications.

For example, Krishnan et al., in U.S. Pat. No. 5,451,551, discloses a chemical mechanical polish (CMP) planarizing method for forming within a microelectronic fabrication a patterned microelectronic conductor layer fully encapsulated within a barrier layer, a surface of which barrier layer is formed planar with a planarized dielectric layer within which is formed the patterned conductor layer fully encapsulated within the barrier layer. The chemical mechanical polish (CMP) planarizing method realizes the foregoing objects by chemical mechanical polish planarizing upon a conformal lower barrier layer formed within a recess within the planarized dielectric layer a chemical mechanical polish (CMP) planarized conductor layer of height less than a remaining depth of the recess, prior to forming and chemical mechanical polish (CMP) planarizing upon the chemical mechanical polish (CMP) planarized conductor layer a conformal upper capping barrier layer contiguous with the conformal lower barrier layer and planar with the planarized dielectric layer.

In addition, Chen et al., in U.S. Pat. No. 5,858,869, discloses a chemical mechanical polish (CMP) planarizing method for forming within a microelectronic fabrication a sandwich composite planarizing dielectric construction which passivates a patterned conductor layer within the microelectronic fabrication, to provide with enhanced process latitude the microelectronic fabrication with a reduced capacitive delay. The chemical mechanical polish (CMP) planarizing method realizes the foregoing objects by employing when forming the sandwich composite planarizing dielectric layer construction a blanket dielectric liner layer formed of an anisotropic plasma oxide formed to a greater thickness upon upper horizontal surfaces of the patterned microelectronic conductor layer within the microelectronic fabrication than upon lower lying sidewall surfaces of the patterned microelectronic conductor layer within the microelectronic fabrication.

Further, Boeck et al., in U.S. Pat. No. 5,880,018, discloses a chemical mechanical polish (CMP) planarizing method for forming within a microelectronic fabrication a series of low dielectric constant inter-level dielectric (ILD) layers formed interposed between the patterns of a patterned microelectronic conductor layer formed within the microelectronic fabrication. The chemical mechanical polish (CMP) planarizing method employs a series of sacrificial dielectric layers which after being employed as a series of chemical mechanical polish (CMP) stop layers for forming the series of patterns within the patterned microelectronic conductor layer within the microelectronic fabrication incident to chemical mechanical polish (CMP) planarizing a blanket microelectronic conductor layer within the microelectronic fabrication is stripped from the microelectronic fabrication to thus provide the series of patterns within the patterned microelectronic conductor layer within the microelectronic fabrication which in turn serve as a series of chemical mechanical polish (CMP) stop layers when forming the series of low dielectric constant inter-level dielectric (ILD) layers formed interposed between the patterns of the patterned microelectronic conductor layer within the microelectronic fabrication incident to chemical mechanical polish (CMP) planarizing a blanket low dielectric constant inter-level dielectric (ILD) layer within the microelectronic fabrication.

Finally, Watts et al., in U.S. Pat. No. 5,897,375, discloses a chemical mechanical polish (CMP) slurry composition for forming within improved properties and process control within a microelectronic fabrication a chemical mechanical polish (CMP) planarized patterned copper containing conductor layer within the microelectronic fabrication. The chemical mechanical polish (CMP) slurry composition comprises an aqueous or alcohol solvent having contained therein: (1) an oxidizing agent such as hydrogen peroxide; (2) a citrate salt; (3) an abrasive powder; and (4) an optional triazole compound.

Desirable in the art of microelectronic fabrication are additional methods and materials which may be employed to form within microelectronic fabrications chemical mechanical polish (CMP) planarized layers and chemical mechanical polish (CMP) planarized structures with enhanced properties, such as enhanced surface planarity uniformity.

It is towards the foregoing objects that the present invention is directed.

SUMMARY OF THE INVENTION

A first object of the present invention is to provide a chemical mechanical polish (CMP) planarizing method for forming a chemical mechanical polish (CMP) planarized layer within a microelectronic fabrication.

A second object of the present invention is to provide a method in accord with the first object of the present invention, where the chemical mechanical polish (CMP) planarized layer is formed with enhanced surface planarity uniformity.

A third object of the present invention is to provide a method in accord with the first object of the present invention and the second object of the present invention, which method is readily commercially implemented.

In accord with the objects of the present invention, there is provided by the present invention a chemical mechanical polish (CMP) planarizing method for forming a chemical mechanical polish (CMP) planarized layer within a microelectronic fabrication. To practice the method of the present invention, there is first provided a substrate. There is then formed over the substrate a chemical mechanical polish (CMP) substrate layer having an aperture formed therein. There is then formed upon the chemical mechanical polish (CMP) substrate layer and completely filling the aperture within the chemical mechanical polish (CMP) substrate layer a blanket chemical mechanical polish (CMP) planarizable layer. There is then chemical mechanical polish (CMP) planarized, while employing a chemical mechanical polish (CMP) planarizing method, the blanket chemical mechanical polish (CMP) planarizable layer to form within the aperture from the blanket chemical mechanical polish (CMP) planarizable layer a patterned chemical mechanical polish (CMP) planarized layer. Within the method, the chemical mechanical polish (CMP) substrate layer has formed therein a pressure compensating layer which compensates for a chemical mechanical polish (CMP) pressure employed within the chemical mechanical polish (CMP) planarizing method such that the patterned chemical mechanical polish (CMP) planarized layer is formed with enhanced surface planarity uniformity.

The present invention provides a chemical mechanical polish (CMP) planarizing method for forming a chemical mechanical polish (CMP) planarized layer within a microelectronic fabrication, where the chemical mechanical polish (CMP) planarized layer is formed with enhanced surface planarity uniformity. The method of the present invention realizes the foregoing object by employing when forming the chemical mechanical polish (CMP) planarized layer within an aperture within a chemical mechanical polish (CMP) substrate layer within a microelectronic fabrication by chemical mechanical polish (CMP) planarizing a chemical mechanical polish (CMP) planarizable layer within the microelectronic fabrication a pressure compensating layer formed within the chemical mechanical polish (CMP) substrate layer, where the pressure compensating layer compensates for a chemical mechanical polish (CMP) pressure employed within the chemical mechanical polish (CMP) planarizing method such that the chemical mechanical polish (CMP) planarized layer is formed with enhanced surface planarity uniformity.

The method of the present invention is readily commercially implemented. As is illustrated within the Description of the Preferred Embodiments which follow, the present invention employs methods and materials which are generally known in the art of microelectronic fabrication, but employed in unique combination within the context of the present invention to provide for the objects, features and advantages of the present invention. Since it is a novel ordering and use of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a chemical mechanical polish (CMP) planarizing method for forming a chemical mechanical polish (CMP) planarized layer within a microelectronic fabrication, where the chemical mechanical polish (CMP) planarized layer is formed with enhanced surface planarity uniformity. The method of the present invention realizes the foregoing object by employing when forming the chemical mechanical polish (CMP) planarized layer within an aperture within a chemical mechanical polish (CMP) substrate layer within a microelectronic fabrication by chemical mechanical polish (CMP) planarizing a chemical mechanical polish (CMP) planarizable layer within the microelectronic fabrication a pressure compensating layer formed within the chemical mechanical polish (CMP) substrate layer, where the pressure compensating layer compensates for a chemical mechanical polish (CMP) pressure employed within the chemical mechanical polish (CMP) planarizing method such that the chemical mechanical polish (CMP) planarized layer is formed with enhanced surface planarity uniformity.

Although the preferred embodiments of the present invention illustrate the present invention within the context of forming chemical mechanical polish (CMP) planarized patterned conductor layers within apertures within chemical mechanical polish (CMP) dielectric substrate layers within microelectronic fabrications, given an appropriate choice of materials, the present invention may be applicable for forming with enhanced surface planarity uniformity chemical mechanical polish (CMP) planarized layers of microelectronic materials including but not limited to microelectronic conductor materials, microelectronic semiconductor materials and microelectronic dielectric materials formed within chemical mechanical polish (CMP) substrate layers independently formed of microelectronic materials including but not limited to microelectronic conductor materials, microelectronic semiconductor materials and microelectronic dielectric materials.

Finally, the present invention may be employed for forming chemical mechanical polish (CMP) planarized layers with enhanced surface planarity uniformity within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Figure 1:
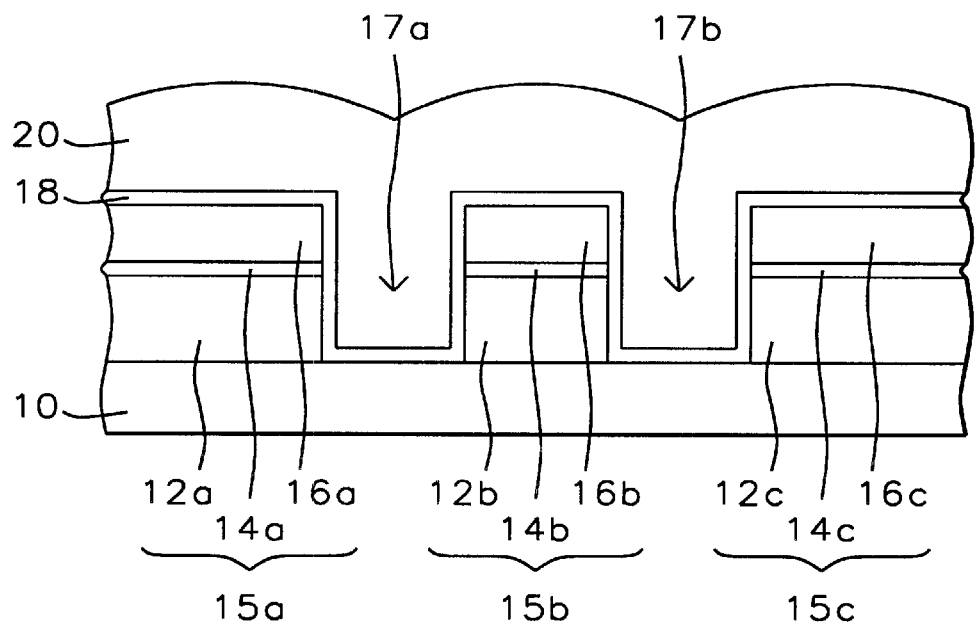
FIG. 1, FIG. 2 and FIG. 3 show a series of schematic cross-sectional diagrams illustrating the results of forming, in accord with a first preferred embodiment of the present invention, a pair of chemical mechanical polish (CMP) planarized patterned conductor stud layers within a dielectric layer within a microelectronic fabrication in accord with the present invention.
Figure 2:
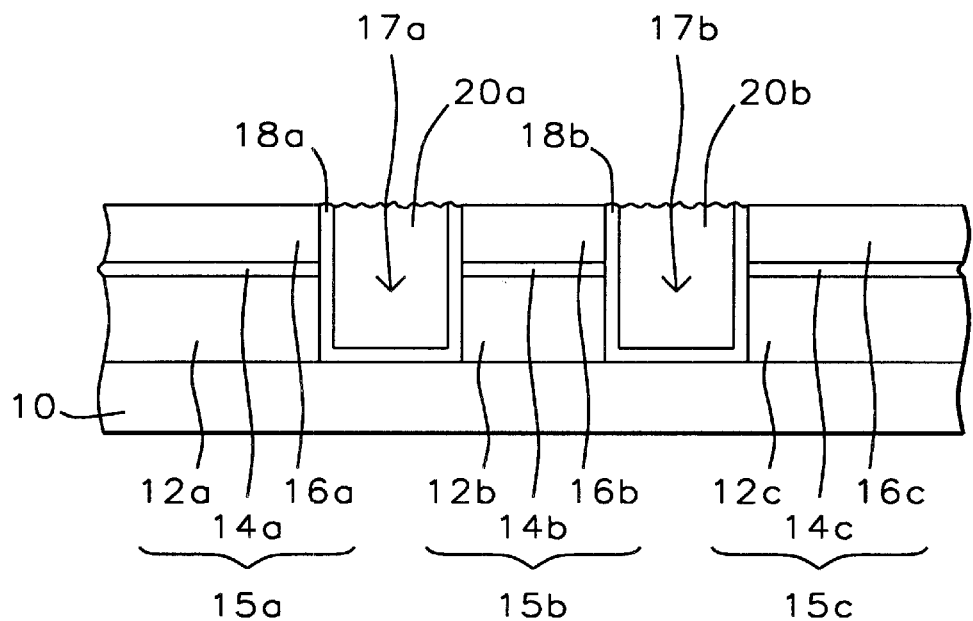
Figure 3:
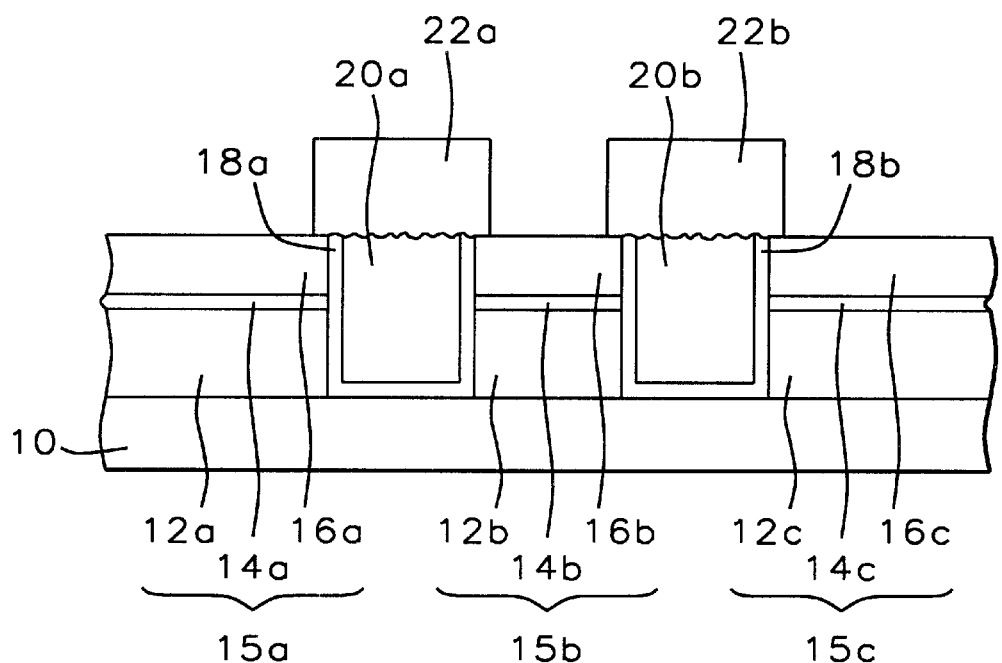

Referring now to FIG. 1 to FIG. 3, there is show a series of schematic cross-sectional diagrams illustrating the results of forming in accord with a first preferred embodiment of the present invention a pair of chemical mechanical polish (CMP) planarized patterned conductor stud layers within a pair of apertures defined by a series of patterned dielectric stack layers within a microelectronic fabrication in accord with the present invention. Shown in FIG. 1 is a schematic cross-sectional diagram of the microelectronic fabrication at an early stage in its fabrication in accord with the first preferred embodiment of the present invention.

Shown in FIG. 1, in a first instance, is a substrate 10 having formed thereupon a series of three patterned dielectric stack layers 15a, 15b and 15c which defines a pair of apertures 17a and 17b, wherein each of the patterned dielectric stack layers 15a, 15b or 15c is formed of a corresponding patterned first dielectric layer 12a, 12b or 12c having formed and aligned thereupon a corresponding patterned pressure compensating layer 14a, 14b or 14c in turn having formed thereupon a corresponding patterned second dielectric layer 16a, 16b or 16c. Within the first preferred embodiment of the present invention, each aperture 17a or 17b within the pair of apertures 17a and 17b is formed of an aperture width of from about 0.15 to about 1.0 microns.

Within the first preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may comprise a substrate alone as employed within the microelectronic fabrication, or in the alternative, the substrate 10 may comprise the substrate as employed within the microelectronic fabrication, where the substrate has formed therein and/or thereupon, and thus incorporated therein, any of several additional layers as are conventional within the microelectronic fabrication within which is employed the substrate. Such additional microelectronic layers, similarly with the substrate itself, may be formed employing microelectronic materials including but not limited to microelectronic conductor materials, microelectronic semiconductor materials and microelectronic dielectric materials.

Similarly, although also not specifically illustrated within the schematic cross-sectional diagram of FIG. 1, the substrate 10 typically but not exclusively when the substrate 10 comprises a semiconductor substrate employed within a semiconductor integrated circuit microelectronic fabrication, has formed therein and/or thereupon, and thus incorporated therein, microelectronic devices as are conventional within the microelectronic fabrication within which is employed the substrate 10. Such microelectronic devices may include, but are not limited to, resistors, transistors, diodes and capacitors.

Within the first preferred embodiment of the present invention with respect to the series of patterned first dielectric layers 12a, 12b and 12c, as well as the series of patterned second dielectric layers 16a, 16b and 16c, within the corresponding series of patterned dielectric stack layers 15a, 15b and 15c, the series of patterned first dielectric layers 12a, 12b and 12c and the series of patterned second dielectric layers 16a, 16b and 16c may be formed of dielectric materials as are conventional in the art of microelectronic fabrication, such dielectric materials including but not limited to silicon oxide dielectric materials, silicon nitride dielectric materials and silicon oxynitride dielectric materials deposited employing methods including but not limited to chemical vapor deposition (CVD) methods, plasma enhanced chemical vapor deposition (PECVD) methods and physical vapor deposition (PVD) sputtering methods. For the first preferred embodiment of the present invention, each of the patterned first dielectric layers 12a, 12b and 12c, as well as each of the patterned second dielectric layers 16a, 16b and 16c, is preferably formed of a silicon oxide dielectric material formed employing a plasma enhanced chemical vapor deposition (PECVD) method, although other methods and materials may be employed for forming the series of patterned first dielectric layers 12a, 12b and 12c, as well as the series of patterned second dielectric layers 16a, 16b and 16c. Similarly, although each of the patterned first dielectric materials 12a, 12b and 12b is typically and preferably formed of the same dielectric material as each of the patterned second dielectric layers,16a, 16b and 16c, such is not required within the present invention or the first preferred embodiment of the present invention. Typically and preferably, each patterned first dielectric layer 12a, 12b or 12c within the series of patterned first dielectric layers 12a, 12b and 12c is formed to a thickness of from about 1000 to about 10000 angstroms, while each patterned second dielectric layer 16a, 16b or 16c within the series of patterned second dielectric layers 16a, 16b and 16c is formed to a thickness of from about 1000 to about 10000 angstroms.

Within the preferred embodiment of the present invention with respect to the patterned pressure compensating layers 14a, 14b and 14c, each of the patterned pressure compensating layers 14a, 14b and 14c is formed of a material having appropriate characteristics to compensate for a first hardness of the corresponding series of patterned first dielectric layers 12a, 12b and 12c and the series of patterned second dielectric layers 16a, 16b and 16c such that when chemical mechanical polish (CMP) planarizing a blanket conductor layer 20 of a second hardness which is also formed over the substrate 10 and into the pair of apertures 17a and 17b, there is formed a pair of chemical mechanical polish (CMP) planarized patterned conductor layers with enhanced surface planarity uniformity.

Thus, within the present invention and the first preferred embodiment of the present invention, a determination is made of relative hardness of: (1) a chemical mechanical polish (CMP) substrate layer having an aperture formed therein into which is desired to form while employing a chemical mechanical polish (CMP) planarizing method from a blanket chemical mechanical polish (CMP) planarizable layer formed upon the chemical mechanical polish (CMP) substrate layer and into the aperture a chemical mechanical polish (CMP) planarized layer; and (2) the blanket chemical mechanical polish (CMP) planarizable layer.

More specifically, within the preferred embodiment of the present invention when: (1) the patterned first dielectric layers 12a, 12b and 12c and the patterned second dielectric layers 16a, 16b and 16c are formed of a dense and hard dielectric material, such as but not limited to a silicon oxide dielectric material, a silicon nitride dielectric material or a silicon oxynitride dielectric material formed employing a plasma enhanced chemical vapor deposition (PECVD) method; and (2) the blanket conductor layer 20 is formed of a comparatively less hard conductor material such as but not limited to an aluminum conductor material or a copper conductor material, the patterned pressure compensating layers 14a, 14b and 14c are formed of a less dense and more resilient (i.e. tough) material, such as but not limited to a less dense nano-porous silicon oxide dielectric material formed employing, for example and without limitation, a hydrogen silsesquioxane (HSQ) spin-on-glass (SOG) dielectric material, although other less dense and more resilient materials may also be employed when forming the patterned pressure compensating layers 14a, 14b and 14c. Such other less dense and more resilient materials may include, but are not limited to, silicate spin-on-glass (SOG) dielectric materials, other silsesquioxane spin-on-glass (SOG) dielectric materials (such as but not limited to alkyl (i.e. methyl and ethyl) silsesquioxane spin-on-glass (SOG) dielectric materials and perfluoroalkyl silsesquioxane spin-on-glass (SOG) dielectric materials), organic polymer spin-on-polymer materials (such as but not limited to polyimide organic polymer spin-on-polymer materials, polyarylene ether organic polymer spin-on-polymer materials and fluorinated analogs thereof). Typically and preferably, the series of patterned pressure compensating layers 14a, 14b and 14c is formed to a thickness of from about 300 to about 3000 angstroms each, while typically and preferably being located closer to the upper interface of the patterned second dielectric layers 16a,. 16b and 16c than the lower interface of the patterned first dielectric layers 12a, 12b and 12c.

When forming the series of patterned pressure compensating layers 14a, 14b and 14c from the hydrogen silsesquioxane dielectric material (for example and without limitation) to form the nano-porous silicon oxide dielectric material, there is typically and preferably employed thermal annealing conditions of from about 300 to about 450 degrees centigrade for a time period of about 15 to about 200 minutes under an atmosphere of nitrogen, ammonia or hydrogen at a pressure of about 1 atm or lower to provide a desired nano-porous structure of the silicon oxide dielectric materials when forming the patterned pressure compensating layers 14a, 14b and 14c.

As is understood by a person skilled in the art, the series of patterned dielectric stack layers 15a, 15b and 15c will typically and preferably be formed incident to plasma etching of a corresponding blanket dielectric stack layer. Incident to such plasma etching, it is intended, particularly when the patterned first dielectric layers 12a, 12b and 12c and the patterned second dielectric layers 16a, 16b and 16c are formed of a hard and dense silicon oxide dielectric material and the patterned pressure compensation layers 14a, 14b and 14c are formed of a nano-porous silicon oxide dielectric material derived from a hydrogen silsesquioxane dielectric material, that the pair of apertures 17a and 17b will be uniformly etched, without intention of the series of patterned pressure compensating layers 14a, 14b and 14c serving as etch stop layers or otherwise providing any unique etch characteristics when forming the pair of apertures 17a and 17b.

Figure 5:
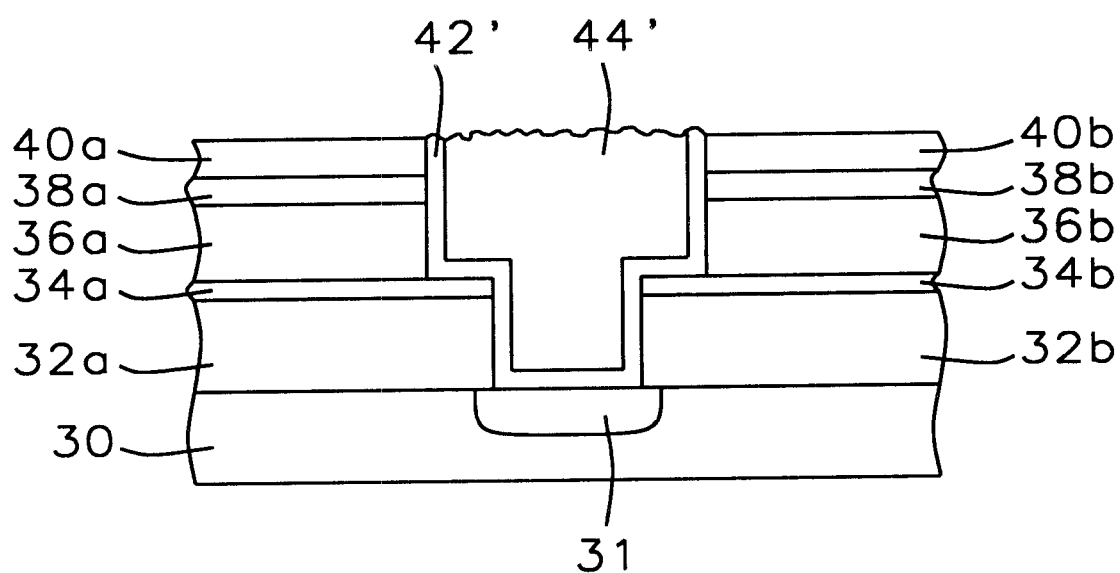

Finally, there is shown within the schematic cross-sectional diagram of FIG. 5 formed upon each of the patterned dielectric stack layers 15a, 15b and 15c and exposed portions of the substrate 10 within the pair of apertures 17a and 17b which is defined by the series of patterned dielectric stack layers 15a, 15b and 15c a blanket barrier layer 18, which in turn has formed thereupon the blanket conductor layer 20, which in turn completely fills each of the apertures 17a and 17b.

Within the preferred embodiment of the present invention with respect to the blanket barrier layer 18, although the blanket barrier layer 18 is optional within the present invention and the first preferred embodiment of the present invention as illustrated within the microelectronic fabrication whose schematic cross-sectional diagram is illustrated in FIG. 1, the blanket barrier layer 18 is conformally formed of a barrier material as is otherwise conventional in the art of microelectronic fabrication, such barrier materials including but not limited to titanium barrier materials, tungsten barrier materials, titanium-tungsten alloy barrier materials, titanium nitride barrier materials and tungsten nitride barrier materials. Typically and preferably, the blanket barrier layer 18 is formed of any of the foregoing barrier materials formed conformally to a thickness of from about 100 to about 800 angstroms.

Finally, within the first preferred embodiment of the present invention with respect to the blanket conductor layer 20, the blanket conductor layer 20 may be formed from conductor materials as are conventional in the art of microelectronic fabrication, including but not limited to aluminum, aluminum alloy, copper, copper alloy, tungsten, tungsten alloy conductor materials, as well as composites thereof and laminates thereof. Typically and preferably, the blanket conductor layer 20 is formed upon the blanket barrier layer of an aluminum, aluminum alloy, copper or copper alloy conductor material formed to a thickness of from about 3000 to about 15000 angstroms, while completely filling each of the apertures 17a and 17b.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2, is a schematic cross-sectional diagram of a microelectronic fabrication otherwise equivalent to the microelectronic fabrication whose schematic cross-sectional diagram is illustrated in FIG. 1, but wherein the blanket conductor layer 20 has been chemical mechanical polish (CMP) planarized to form a pair of chemical mechanical polish (CMP) planarized patterned conductor stud layers 20a and 20b and the blanket barrier layer 18 has been chemical mechanical polish (CMP) planarized to form a pair of chemical mechanical polish (CMP) planarized patterned barrier layers 18a and 18b.

Within the present invention, the pair of chemical mechanical polish (CMP) planarized patterned conductor stud layers 20a and 20b, and the pair or chemical mechanical polish (CMP) planarized patterned barrier layers 18a and 18b is formed with enhanced surface planarity uniformity due to the presence of the series of patterned pressure compensating layers 14a, 14b and 14c within the series of patterned dielectric stack layers 15a, 15b and 15c.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is formed contacting the pair of chemical mechanical polish (CMP) planarized patterned conductor stud layers 20a and 20b and the pair of chemical mechanical polish (CMP) planarized patterned barrier layers 18a and 18b and bridging to the series of patterned second dielectric layers 16a, 16b and 16c a pair of patterned conductor interconnect layers 22a and 22b. The pair of patterned conductor interconnect layers 22a and 22b may be formed employing methods and materials as are conventional in the art of microelectronic fabrication, including but not limited to thermally assisted evaporation methods, electron beam assisted evaporation methods and physical vapor deposition (PVD) methods, in conjunction with photolithographic patterning methods, which may provide the patterned conductor interconnect layers 22a and 22b of conductor materials including but not limited to metal and metal alloy conductor materials, such as but not limited to the aluminum, aluminum alloy, copper, copper alloy, tungsten or tungsten alloy conductor materials from which may be formed the pair of chemical mechanical polish (CMP) planarized patterned conductor stud layers 20a and 20b. Typically and preferably, each of the patterned conductor interconnect layers 22a and 22b is formed to a thickness of from about 2000 to about 10000 angstroms.

As is illustrated within the schematic cross-sectional diagram of FIG. 3, the pair of patterned conductor interconnect layers 22a and 22b forms a reliable connection with the pair of chemical mechanical polish (CMP) planarized patterned conductor stud layers 20a and 20b and the pair of chemical mechanical polish (CMP) planarized patterned barrier layers 18a and 18b since the pair of chemical mechanical polish (CMP) planarized patterned conductor stud layers 20a and 20b and the pair of chemical mechanical polish (CMP) planarized patterned barrier layers 18a and 18b is formed without significant dishing since, in turn, as noted above, the series of patterned dielectric stack layers 15a, 15b and 15c has formed therein a series of patterned pressure compensating layers 14a, 14b and 14c.

Second Preferred Embodiment

Figure 4:
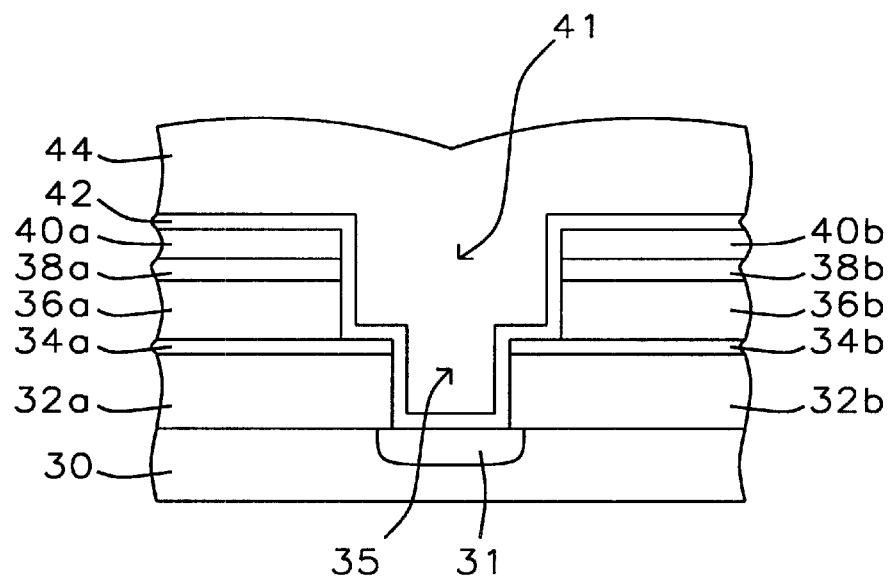
FIG. 4 and FIG. 5 show a pair of schematic cross-sectional diagrams illustrating the results of forming in accord with a second preferred embodiment of the present invention a chemical mechanical polish (CMP) planarized contiguous patterned conductor interconnect layer and conductor stud layer within a dielectric layer within a microelectronic fabrication in accord with the present invention.

Referring now to FIG. 4 and FIG. 5 there is shown a pair of schematic cross-sectional diagrams illustrating the results of forming in accord with a second embodiment of the present invention a contiguous patterned conductor interconnect layer and conductor contact stud layer within a dielectric layer within a microelectronic fabrication in accord with the present invention. Shown in FIG. 4 is a schematic cross-sectional diagram illustrating the microelectronic fabrication at an early stage in-its fabrication in accord with the second preferred embodiment of the present invention.

Shown in FIG. 4, in a first instance, is a substrate 30, having formed therein a contact region 31, where the contact region 31 is accessed by a via 35 defined by a pair of patterned lower dielectric layers 32a and 32b in turn having formed aligned thereupon a pair of patterned etch stop layers 34a and 34b. Similarly, there is also shown within FIG. 4 formed upon each of the patterned etch stop layers 34a and 34b a corresponding pair of patterned intermediate dielectric layers 36a and 36b having formed aligned thereupon a pair of patterned pressure compensating layers 38a and 38b in turn having formed aligned thereupon a pair of patterned upper dielectric layers 40a and 40b, where the pair of patterned intermediate dielectric layers 36a and 36b, the pair of patterned pressure compensating layers 38a and 38b and the pair of patterned upper dielectric layers 40a and 40b in turn define a trench 41 into which is subsequently formed a patterned conductor interconnect layer which is contiguous with a patterned conductor stud layer which is formed within the via 35.

Within the second preferred embodiment of the present invention with respect to the substrate 30 having formed therein the contact region 31, the substrate 30 is typically and preferably formed employing methods and materials analogous or equivalent to the methods and materials employed for forming the substrate 10 as employed within the first preferred embodiment of the present invention as illustrated within the schematic cross-sectional diagram of FIG. 1. Although no corresponding structure is illustrated within the schematic cross-sectional diagram of FIG. 1, the contact region 31 within the substrate 30 as illustrated within the schematic cross-sectional diagram of FIG. 4 is also conventional in the art of microelectronic fabrication, where the contact region 31 will generally comprise either a conductor contact region or a semiconductor contact region.

Similarly, within the second preferred embodiment of the present invention with respect to the pair of patterned lower dielectric layers 32a and 32b, the pair of patterned intermediate dielectric layers 36a and 36b and the pair of patterned upper dielectric layers 40a and 40b, the pair of patterned lower dielectric layers 32a and 32b, the pair of patterned intermediate dielectric layers 36a and 36b and the pair of patterned upper dielectric layers 40a and 40b are typically and preferably formed employing methods and materials analogous or equivalent to the methods and materials employed for forming the series of patterned first dielectric layers 12a, 12b and 12c and the series of patterned second dielectric layers 16a, 16b and 16c within the first preferred embodiment of the present invention as illustrated within the schematic cross-sectional diagram of FIG. 1. Typically and preferably, the pair of patterned lower dielectric layers 32a and 32b is formed to a thickness of from about 1000 to about 10000 angstroms, while the pair of patterned intermediate dielectric layers 36a and 36b is formed to a thickness of from about 1000 to about 10000 angstroms and the pair of patterned upper dielectric layers 40a and 40b is formed to a thickness of from about 1000 to about 10000 angstroms. Similarly with the first preferred embodiment of the present invention, no two pair of the foregoing pairs of patterned dielectric layers need necessarily be formed of the same dielectric material.

Similarly, within the second preferred embodiment of the present invention with respect to the pair of patterned pressure compensating layers 38a and 38b, the pair of patterned pressure compensating layers 38a and 38b is typically and preferably formed employing methods, materials and dimensions analogous or equivalent to the methods, materials and dimensions employed for forming the series of patterned pressure compensating layers 14a, 14b and 14c within the first preferred embodiment of the present invention as illustrated within the schematic cross-sectional diagram of FIG. 1.

Finally, within the second preferred embodiment of the present invention with respect to the pair of patterned etch stop layers 34a and 34b, the pair of patterned etch stop layers 34a and 34b is formed of an etch stop material which allows for optimal definition of the via 35 with respect to the trench 41 while employing a pair of sequential photolithographic patterning methods, and while not overetching into the pair of patterned lower dielectric layers 32a and 32b. Typically and preferably, when the pair of patterned upper dielectric layers 40a and 40b, the pair of patterned intermediate dielectric layers 36a and 36b and the pair of patterned lower dielectric layers 32a and 32b is formed of a silicon oxide dielectric material as is conventional in the art of microelectronic fabrication, the pair of patterned etch stop layers 34a and 34b will typically and preferably be formed of a silicon nitride etch stop material or a silicon oxynitride etch stop material as is similarly conventional in the art of microelectronic fabrication. Typically and preferably, the pair of patterned etch stop layers 34a and 34b is formed to a thickness of from about 200 to about 1500 angstroms.

Shown also within the schematic cross-sectional diagram of FIG. 4 is a blanket barrier layer 42 formed conformally covering the microelectronic fabrication and formed conformally into the trench 41 and the via 35, wherein the blanket barrier layer 42 in turn has formed thereupon a blanket conductor layer 44.

Within the second preferred embodiment of the present invention with respect to the blanket barrier layer 42, the blanket barrier layer 42 is typically and preferably formed. employing methods, materials and dimensions analogous or equivalent to the methods, materials and dimensions employed for forming the blanket barrier layer 18 within the first preferred embodiment of the present invention, as illustrated within the schematic cross-sectional diagram of FIG. 1. Similarly, within the second preferred embodiment of the present invention with respect to the blanket conductor layer 44, the blanket conductor layer 44 is typically and preferably formed employing methods and materials analogous or equivalent to the methods and materials employed for forming the blanket conductor layer 20 within the first preferred embodiment of the present invention, as illustrated within the schematic cross-sectional diagram of FIG. 1, although there may be employed within the second preferred embodiment of the present invention an increased thickness of the blanket conductor layer 44 in comparison with the thickness of the blanket conductor layer 20 within the first preferred embodiment of the present invention, such increased thickness in a range of from about 5000 to about 30000 angstroms, in order to completely fill the trench 41 and the via 35.

Referring now to FIG. 5, there is shown a schematic cross-sectional diagram illustrating the results of further processing of the microelectronic fabrication whose schematic cross-sectional diagram is illustrated in FIG. 4. Shown in FIG. 5 is a schematic cross-sectional diagram of a microelectronic fabrication otherwise equivalent to the microelectronic fabrication whose schematic cross-sectional diagram is illustrated in FIG. 4, but wherein the blanket conductor layer 44 and the blanket barrier layer 42 have been chemical mechanical polish (CMP) planarized to form a corresponding chemical mechanical polish (CMP) planarized patterned. barrier layer 42' having formed thereupon a corresponding chemical mechanical polish (CMP) planarized patterned conductor layer 44', where the chemical mechanical polish (CMP) planarized patterned conductor layer 44' serves as a contiguous patterned conductor interconnect layer within the trench 41 and a patterned conductor stud layer within the via 35.

Similarly with the first preferred embodiment of the present invention as illustrated within the schematic cross-sectional diagram of FIG. 2, within the second preferred embodiment of the present invention as illustrated within the schematic cross-sectional diagram of FIG. 5, the chemical mechanical polish (CMP) planarized patterned conductor layer 44' and the chemical mechanical polish (CMP) planarized patterned barrier layer 42' are formed with enhanced surface planarity uniformity due to the presence of the pair of pressure compensating layers 38a and 38b.

EXAMPLES

There was obtained two eight inch diameter semiconductor substrates and there was formed upon a first of the two semiconductor substrates a single layer blanket dielectric layer formed of a silicon oxide dielectric material deposited employing a plasma enhanced chemical vapor deposition (PECVD) method employing tetraethylorthosilicate (TEOS) as a silicon source material. The plasma enhanced chemical vapor deposition (PECVD) method also employed: (1) a reactor chamber pressure of about 8 torr; (2) a radio frequency source power of about 670 watts at a source radio frequency of 13.56 MHZ; (3) a semiconductor substrate temperature of about 400 degrees centigrade; (4) a tetraethylorthosilicate (TEOS) flow rate of about 1000 milligrams per cubic meter in a helium carrier gas flow of about 1200 standard cubic centimeters per minute (sccm); and (5) an oxygen oxidant flow of about 1000 standard cubic centimeters per minute (sccm). The silicon oxide single layer blanket dielectric layer was formed to a thickness of about 1000 angstroms upon the first semiconductor substrate.

Upon the second semiconductor substrate was formed a blanket dielectric stack layer comprising: (1) a first silicon oxide blanket dielectric layer, having formed thereupon; (2) a blanket pressure compensating layer, in turn having formed thereupon; (3) a second silicon oxide blanket dielectric layer, in accord with the present invention. Each of the first silicon oxide blanket dielectric layer and the second silicon oxide blanket dielectric layer was formed of the same silicon oxide dielectric material employing for forming the silicon oxide single layer blanket dielectric layer formed upon the first semiconductor substrate, however, there was formed interposed therebetween the blanket pressure compensating layer formed of a hydrogen silsesquioxane dielectric material obtained from Dow Corning Corporation as FOX (™) hydrogen silsesquioxane dielectric material.

The hydrogen silsesquioxane dielectric material was coated and cured at a temperature of about 400 degrees centigrade for a time period of about 45 minutes within a nitrogen atmosphere at a pressure of about 1 atm to form the blanket pressure compensating layer of a thickness of about 3000 angstroms. The first silicon oxide (lower) blanket dielectric layer was formed to a thickness of about 1000 angstroms and the second silicon oxide (upper) blanket dielectric layer was formed to a thickness of about 2000 angstroms.

Upon each of (1) the silicon oxide single layer blanket dielectric layer formed upon the first semiconductor substrate; and (2) the blanket dielectric stack layer formed upon the second semiconductor substrate, was then formed a patterned photoresist layer of thickness about 7000 angstroms which defined a series of apertures of bidirectional linewidth about 0.3 by about 10 microns, which apertures in turn defined the locations of series of vias to be formed through each of the silicon oxide single layer blanket dielectric layer and the blanket dielectric stack layer. The series of vias were then etched while employing a plasma etch method employing an etchant gas composition comprising carbon tetrafluoride and argon. The plasma etch method also employed: (1) a reactor chamber pressure of about 50 torr; (2) a source radio frequency power of about 1125 watts a source radio frequency of 13.56 MHZ and a bias power of about 250 watts; (3) a semiconductor substrate temperature of about 90 degrees centigrade; (4) a carbon tetrafluoride flow rate of about 40 standard cubic centimeters per minute (sccm); and (5) an argon flow rate of about 150 standard cubic centimeters per minute (sccm).

The patterned photoresist layers were then stripped from: (1) the resulting silicon oxide single layer patterned dielectric layer formed upon the first semiconductor substrate; or (2) the resulting patterned dielectric stack layer formed upon the second semiconductor substrate, while employing an oxygen containing plasma stripping method as is otherwise conventional in the art of microelectronic fabrication.

There was then formed upon the silicon oxide single layer patterned dielectric layer formed upon the first semiconductor substrate and the patterned dielectric stack layer formed upon the second semiconductor substrate a blanket copper layer formed to a thickness of about 9000 angstroms while employing a physical vapor deposition (PVD) method and electrochemical deposition (ECD) method which completely filled the series of vias within each of the silicon oxide single layer patterned dielectric layer and the patterned dielectric stack layer.

Each of the blanket copper layers was then chemical mechanical polish (CMP) planarized while employing an aqueous slurry composition comprising potassium permanganate and an abrasive material. The chemical mechanical polish (CMP) planarizing method also employed: (1) a platen pressure of about 4.5 pounds per square inch; (2) a head rotation speed of about 12 revolutions per minute (rpm); (3) a platen counter-rotation speed of about 45 revolutions per minute (rpm); (4) a semiconductor substrate temperature of about 25 degrees centigrade; and (5) a slurry feed rate of about 250 cubic centimeters per minute (ccm). The blanket copper layers were chemical mechanical polish (CMP) planarized while employing the silicon oxide single layer patterned dielectric layers or the patterned dielectric stack layers as a polish stop layer, to a polish stop end point as evidenced as a change in chemical mechanical polish (CMP) polishing torque.

There was then cross-sectioned each of the semiconductor substrates and measured for a series of chemical mechanical polish (CMP) planarized patterned copper containing stud layers an extent of dishing (as measured by an extent of deviation of the chemical mechanical polish (CMP) planarized patterned copper containing stud layers from a horizontal line which included the surface of the silicon oxide single layer patterned dielectric layer or the patterned dielectric stack layer. The results of such measurements are reported in Table I.

TABLE I

| Dielectric Layer Fabrication | Deviation from Horizontal (microns) |
|---|---|
| Without Pressure Comp Layer | 500 +/− 50 |
| With Pressure Comp Layer | 150 +/− 50 |

As is seen from review of the data within Table I, there is substantially less deviation from horizontal within a chemical mechanical polish (CMP) planarized patterned copper containing stud layer when planarized within a aperture formed by a patterned dielectric stack layer having formed therein a pressure compensating layer than within an aperture defined by a patterned dielectric layer not having formed therein a pressure compensating layer.

As is understood by a person skilled in the art, the preferred embodiments and examples of the present invention are illustrative of the present invention rather than limiting of the present invention. Revisions and modifications may be made to methods, materials, strictures and dimensions through which is formed a microelectronic fabrication in accord with the preferred embodiments and examples of the present invention while still providing microelectronic fabrications in accord with the present invention, in accord with the appended claims.

What is claimed is:

1. A chemical mechanical polish planarizing method for forming a chemical mechanical polish planarized layer, comprising the steps:

providing a substrate;

forming over the substrate a first inorganic layer;

forming over the first inorganic layer an organic material layer;

forming over the organic material layer a second inorganic layer;

patterning through the second inorganic layer, the organic material layer and the first inorganic layer to form at least one aperture;

forming a conductor layer over the second inorganic layer to at least fill the at least one aperture;

planarizing the conductor layer to form a planarized conductor layer portion within the at least one aperture, the organic material layer functioning as a pressure compensating layer which compensates for the planarizing pressure employed during planarization of the conductor layer whereby the planarized conductor layer portion is formed with enhanced surface planarity uniformity.

2. The method of claim 1, wherein the organic material layer is formed of organic polymer spin-on-polymer materials.

3. The method of claim 1, wherein the organic material layer is formed of a material selected from the group consisting of: alkyl silsesquioxane SOG dielectric materials; perfluoroalkyl silsesquioxane SOG dielectric materials; polyimide organic polymer spin-on-polymer materials; polyarylene ether organic polymer spin-on-polymer materials; fluorinated polyimide organic polymer spin-on-polymer materials; and fluorinated polyarylene ether organic polymer spin-on-polymer materials.

4. The method of claim 1, wherein the first inorganic layer has a thickness greater than the thickness of the second inorganic layer.

5. The method of claim 1, wherein the organic material layer has a thickness of from about 300 to 3000 Å.

6. The method of claim 1, wherein the first and second inorganic layers are each comprised of a material selected from the group consisting of silicon oxide, silicon nitride and silicon oxynitride.

7. The method of claim 1, wherein the first and second inorganic layers are each comprised of a material selected from the group consisting of silicon oxide, silicon nitride and silicon oxynitride; and wherein the first and second inorganic layers are each deposited by a method selected from the group consisting of chemical vapor deposition methods, plasma enhanced chemical vapor deposition methods and physical vapor deposition methods.

8. The method of claim 1, wherein the first and second inorganic layers are comprised of oxide.

9. The method of claim 1, wherein the first and second inorganic layers are comprised of oxide formed by a plasma enhanced chemical vapor deposition method.

10. The method of claim 1, wherein the conductor layer is comprised of a material selected from the group consisting of aluminum, an aluminum alloy, copper, a copper alloy, tungsten, a tungsten alloy, composites of the materials and laminates of the materials.

11. The method of claim 1, wherein the conductor layer is comprised of a material selected from the group consisting of aluminum, an aluminum alloy, copper and a copper alloy.

12. A chemical mechanical polish planarizing method for forming a chemical mechanical polish planarized layer, comprising the steps:

providing a substrate;

forming over the substrate a first oxide layer;

forming over the first inorganic layer an organic material layer;

forming over the organic material layer a second oxide layer;

patterning through the second oxide layer, the organic material layer and the first oxide layer to form at least one aperture;

forming a conductor layer over the second oxide layer to at least fill the at least one aperture;

planarizing the conductor layer to form a planarized conductor layer portion within the at least one aperture, the organic material layer functioning as a pressure compensating layer which compensates for the planarizing pressure employed during planarization of the conductor layer whereby the planarized conductor layer portion is formed with enhanced surface planarity uniformity.

13. The method of claim 12, wherein the organic material layer is formed of organic polymer spin-on-polymer materials.

14. The method of claim 12, wherein the organic material layer is formed of a material selected from the group consisting of: alkyl silsesquioxane SOG dielectric materials; perfluoroalkyl silsesquioxane SOG dielectric materials; polyimide organic polymer spin-on-polymer materials; polyarylene ether organic polymer spin-on-polymer materials; fluorinated polyimide organic polymer spin-on-polymer materials; and fluorinated polyarylene ether organic polymer spin-on-polymer materials.

15. The method of claim 12, wherein the first oxide layer has a thickness greater than the thickness of the second oxide layer.

16. The method of claim 12, wherein the organic material layer has a thickness of from about 300 to 3000 Å.

17. The method of claim 12, wherein the first and second oxide layers are each comprised of silicon oxide.

18. The method of claim 12, wherein the first and second oxide layers are each deposited by a method selected from the group consisting of chemical vapor deposition methods, plasma enhanced chemical vapor deposition methods and physical vapor deposition methods.

19. The method of claim 12, wherein the first and second oxide layers are formed by a plasma enhanced chemical vapor deposition method.

20. The method of claim 12, wherein the conductor layer is comprised of a material selected from the group consisting of aluminum, an aluminum alloy, copper, a copper alloy, tungsten, a tungsten alloy, composites of the materials and laminates of the materials.

21. The method of claim 12, wherein the conductor layer is comprised of a material elected from the group consisting of aluminum, an aluminum alloy, copper and a copper alloy.

* * * * *